United States Patent [19]
Barber

[11] Patent Number: 5,723,369
[45] Date of Patent: Mar. 3, 1998

[54] METHOD OF FLIP CHIP ASSEMBLY

[75] Inventor: Ivor G. Barber, San Jose, Calif.

[73] Assignee: LSI Logic Corporation, Milpitas, Calif.

[21] Appl. No.: 615,865

[22] Filed: Mar. 14, 1996

[51] Int. Cl.$^6$ .............................. H01L 21/44; H01L 21/48
[52] U.S. Cl. ..................... 438/106; 438/108; 438/127
[58] Field of Search ...................... 437/209, 220; 257/787; 438/106, 107, 108, 110, 112, 122, 123, 127

[56] References Cited

U.S. PATENT DOCUMENTS

| | | | |
|---|---|---|---|
| 5,120,665 | 6/1992 | Tsukagoshi et al. | 437/209 |
| 5,409,865 | 4/1995 | Karnezos | 437/220 |
| 5,450,283 | 9/1995 | Lin et al. | 257/787 |
| 5,490,324 | 2/1996 | Newmann | 437/209 |
| 5,519,936 | 5/1996 | Andros et al. | 437/220 |
| 5,578,525 | 11/1996 | Mizukoshi | 437/220 |

OTHER PUBLICATIONS

Tummala et al, "Microelectronics Packaging Handbook", Van Nostrand Reinhold, pp. 363–373, 443–445, 1989.

*Primary Examiner*—John Niebling
*Assistant Examiner*—Michael S. Lebentritt
*Attorney, Agent, or Firm*—Luedeka, Neely & Graham, P.C.

[57] ABSTRACT

To assemble a flip chip in a package, the back of the flip chip is coated with a heat conductive material and a heat conductive substrate is attached to the heat conductive material. Solder bumps are attached to the front of the flip chip and to a package substrate to mount the flip chip on the package, leaving a space between the flip chip and the package substrate. The space between the flip chip and the package substrate is under filled with a heat conductive media, and the flip chip is encapsulated against the package substrate with a peripheral mold such that at least a portion of the conductive substrate remains exposed. A final package is formed by electrical connectors attached to the package substrate.

12 Claims, 2 Drawing Sheets

METHOD OF FLIP CHIP ASSEMBLY

FIELD OF THE INVENTION

This invention relates to the field of integrated circuit packaging. More particularly the invention relates to surface mount packaging for flip chip semiconductor devices.

BACKGROUND OF THE INVENTION

Integrated circuits are typically packaged before they are used with other components as parts of larger electronic systems. The packages provide electrical connections to the contact areas of the integrated circuit, and also provide protection for the fragile circuit. Surface mount technology packages are especially preferred in manufacturing because of their relatively small size, low cost, and reduced weight. A surface mount package is designed to be attached directly to the circuit board in which the integrated circuit is to be used.

It is important that the package provide some means to conduct away the heat generated by the integrated circuit during use. If the package provides too much resistance to heat conduction, then the heat generated by the integrated circuit stays in the vicinity of the integrated circuit. The heat that is thus built-up during use may eventually damage the integrated circuit.

To aid in conducting heat away from the integrated circuit, heat conductive media such as thermal conductive epoxy or thermal grease is placed in the areas between the integrated circuit and the package. This under-filling and over-coating of the integrated circuit with the heat conductive media is done after the integrated circuit has been attached to the surface mount package, but before a lid or other encapsulation is placed on the package.

Unfortunately, voids are often left in the heat conductive media. A void may be created by contamination on the integrated circuit or the package, which reduces adhesion between the media and the contaminated surface. Also, a warp in the integrated circuit may tend to create a void in the media. These voids tend to reduce the ability of the media to effectively conduct heat away from the integrated circuit. Thus, the integrated circuit tends to overheat, and may fail.

Another problem with this traditional method of assembling integrated circuits into surface mount packages is that the integrated circuit is attached to a relatively flexible portion of the package early in the assembly process. The integrated circuit is thus exposed to stress caused by the flexing of the package during subsequent handling. These stresses tend to crack the integrated circuit mounted on the package, or cause the electrical connections between the integrated circuit and the package to fail. Either the cracks in the integrated circuit or the failed electrical connections may cause the integrated circuit to fail during use.

The problems described above, voids in the heat conductive media and cracking of the integrated circuit or electrical connections, are especially pernicious because they cannot be detected until later in the packaging process. At that point, failure of the packaged integrated circuit means that not only is the integrated circuit scrapped, but so too is all of the packaging. Additionally, all of the expense of labor expended on packaging the integrated circuit is also lost.

What is needed, therefore, is a method of assembling an integrated circuit in a package such that good thermal conduction between the integrated circuit and the outside of the package is ensured and that the integrated circuit is protected at a relatively early point in the process from the stresses induced by handling. What is further needed is such a method where failure of the integrated circuit or electrical connections due to cracking can be detected prior to the point where the expenses of packaging material and other assembly costs are incurred.

SUMMARY OF THE INVENTION

The above and other objects are met by a method of assembling a flip chip in a package. In accordance with a method of the present invention, the back of the flip chip is coated with a heat conductive adhesive material, and a heat conductive substrate is attached to the heat conductive material. Before or after the aforementioned steps, solder bumps are attached to the front of the flip chip or to a package substrate, and the flip chip is mounted to the package substrate using the solder bumps, and a space is left between the flip chip and the package substrate. The space between the flip chip and the package substrate is under filled with a heat conductive media, and the flip chip is encapsulated against the package substrate with a peripheral mold such that at least a portion of the conductive substrate remains exposed. The final package is formed by attaching electrical connectors to the package substrate.

BRIEF DESCRIPTION OF THE DRAWINGS

Advantages of the invention will become more apparent by reference to the detailed description of the invention when considered in conjunction with the following drawings, which are not to scale, in which like reference numerals denote like elements throughout the several views, and wherein.

DETAILED DESCRIPTION OF THE INVENTION

Figure 1:
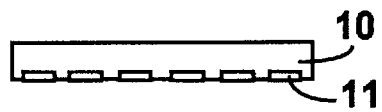
FIG. 1 is a cross-sectional view of a flip chip.
Figure 2:
FIG. 2 is a cross-sectional view of a flip chip coated with a heat conductive adhesive material.

Referring now to the drawings, there is depicted in FIG. 1 a flip chip 10 having a back and a front. On the front of flip chip 10 there are disposed a series of bonding pads 11, through which electrical connection to the flip chip can be made. Flip chip 10 is coated on the back with a heat conductive material 12, as depicted in FIG. 2. It will be appreciated that the relative sizes of the various elements depicted are not to scale, so as to more easily depict those elements which are very small or thin as compared to the other elements.

The heat conductive material 12 may be applied by any one of a number of different methods commonly used in the art, such as without limitation, spraying, rolling, brushing, spinning, or screen printing. The heat conductive material 12 is preferably a heat conductive epoxy. A heat conductive epoxy sold under the trade name of ABLEBOND 965IL by Ablestik of Rancho Dominguez California has been found to work well in implementing a method of the invention described herein.

The heat conductive adhesive material 12 is preferably applied to a thickness of between about one mil and about five mils, and most preferably about two mils. The heat conductive material 12 is cured for between about thirty minutes and about 120 minutes, and most preferably about sixty minutes, at a temperature of between about 125° C. and about 175° C., and most preferably about 150° C. The cure is preferably done in an atmosphere of air.

Figure 3:
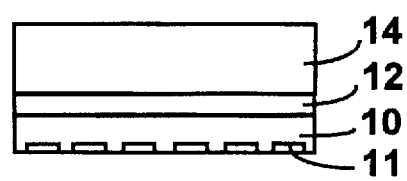
FIG. 3 is a cross-sectional view of a flip chip attached to a heat conductive substrate.

A heat conductive substrate 14 is attached to the flip chip 10 using the heat conductive material 12, as depicted in FIG. 3. The heat conductive substrate 14 is preferably copper, but may also be formed of copper/tungsten, aluminum, or ceramic. The heat conductive substrate 14 preferably has a thickness of between about twenty mils and about sixty mils, and most preferably about thirty mils. As depicted in FIG. 3, the heat conductive substrate 14 is substantially the same width and depth as the flip chip 10, but in alternate embodiments the heat conductive substrate 14 is either smaller than or larger than the flip chip 10.

In the embodiment depicted, the heat conductive material 12 is applied first to the flip chip 10, and then the heat conductive substrate 14 is attached to the flip chip 10. In an alternate embodiment the heat conductive material 12 is first applied to the heat conductive substrate 14, and then the flip chip 10 is attached to the heat conductive substrate 14 by means of the heat conductive material 12.

Figure 4:
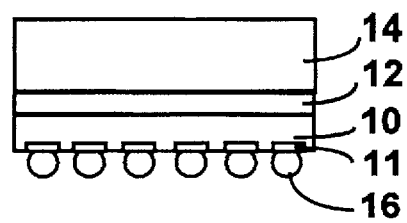
FIG. 4 is a cross-sectional view of a flip chip with solder bumps attached.
Figure 5:
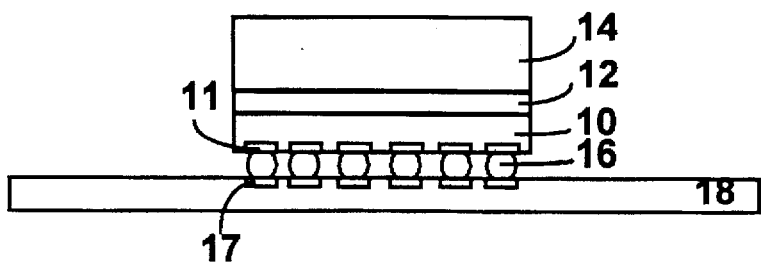
FIG. 5 is a cross-sectional view of a flip chip mounted to a package substrate.
Figure 6:
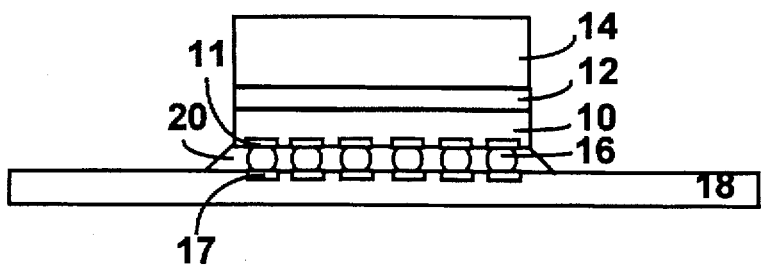
FIG. 6 is a cross-sectional view of a flip chip under-filled with a heat conductive media.

Solder bumps 16 are attached to the bonding pads 11 on the front of flip chip 10 as depicted in FIG. 4. Referring to FIG. 5, it will be appreciated that the solder bumps 16 may be first attached to either pads 11 or pads 17. The solder bumps 16 may be attached to the pads 11 of flip chip 10 prior to attaching the flip chip 10 to the heat conductive substrate 14. The material used to form the solder bumps 16 is preferably a tin lead solder. The flip chip 10 is mounted to bonding pads 17 on a package substrate 18 by use of the solder bumps 16. The package substrate 18 may be formed of, without limitation, materials such as circuit board, flex circuit, plastic, or ceramic. An interstitial space, left between the package substrate 18 and the flip chip 10, is under filled with a heat conductive media 20 as depicted in FIG. 6.

Figure 7:
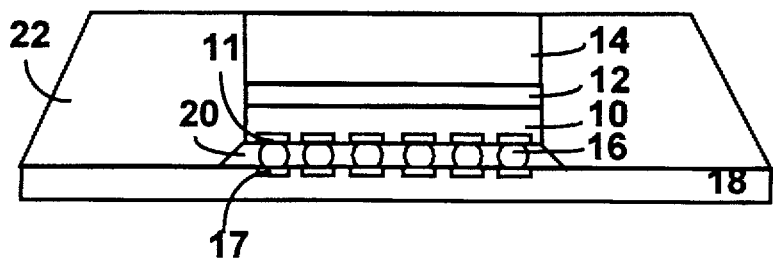
FIG. 7 is a cross-sectional view of a flip chip encapsulated against a package substrate with a peripheral mold.

The heat conductive media 20 is preferably a heat conductive epoxy such as any one of a number of materials well known to those of ordinary skill in the art. The flip chip 10 is encapsulated against the package substrate 18 with a peripheral mold 22, as depicted in FIG. 7. The peripheral mold 22 is selected from among any of the number of materials, such as epoxy, well known to those of ordinary skill in the art.

The flip chip 10 is encapsulated within the peripheral mold 22 such that at least a portion of the heat conductive substrate 14 remains exposed. Preferably, the peripheral mold 22 is formed so as to be coplanar with one surface of the heat conductive substrate 14, so that just that surface of the heat conductive substrate 14 is left exposed, as depicted in FIG. 7. In alternate embodiments, the sides of heat conductive substrate 14 are either partially or wholly exposed by the peripheral mold 22.

Figure 8:
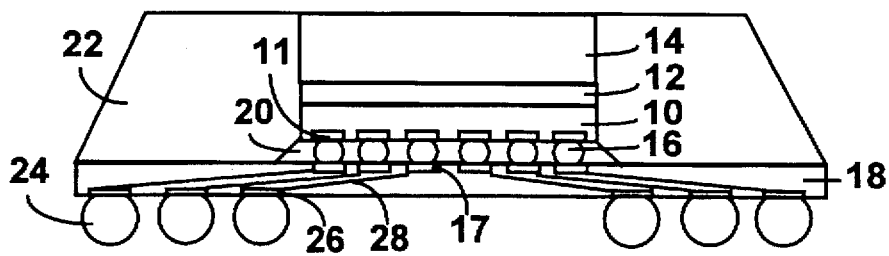
FIG. 8 is a cross-sectional view of solder balls attached to a package substrate.

The package is completed by attaching electrical connectors, such as solder balls 24, to contact pads 26 located on the package substrate 18, as depicted in FIG. 8. The contact pads 26 are electrically connected to the pads 17 by leads 28. Thus electrical continuity is provided from the flip chip 10 to the solder balls 24. The solder balls 24 are comprised of materials, and attached by methods, that are well known to those of ordinary experience in the art. In alternate embodiments other electrical connectors, such as pins, may be used.

By use of a method of assembling a flip chip in a package according to the present invention, the problems associated with the traditional methods are overcome. For example, because the heat conductive material 12 is applied during one of the first steps of the method, there is opportunity to determine if voids exist in the heat conductive material 12 prior to other materials being committed to forming the package.

Further, because the flip chip 10 is given support by the heat conductive substrate 14 at an early step in the process, the flip chip 10 is protected from the stresses caused by subsequent handling and processing. Therefore, fewer, and preferably none, of the flip chips 10 are cracked or delaminated during assembly. Thus, the expense of lost material and other assembly costs associated with these defects are reduced.

While specific embodiments of the invention have been described with particularity above, it will be appreciated that the invention is equally applicable to numberless processes well known to those skilled in the art.

What is claimed is:

1. A method of assembling a flip chip in a package comprising:

coating the back of the flip chip with a heat conductive adhesive material, attaching a heat conductive substrate to the heat conductive material, mounting the flip chip to a package substrate using solder bumps attached between the front of the flip chip and the package substrate, there being a space left between the flip chip and the package substrate, under filling the space between the flip chip and the package substrate with a heat conductive media, encapsulating the flip chip against the package substrate with a peripheral mold such that at least a portion of the conductive substrate remains exposed, and attaching electrical connectors to the package substrate, to form the package.

2. The method of claim 1 wherein the heat conductive material comprises epoxy.

3. The method of claim 1 wherein the heat conductive substrate comprises copper.

4. The method of claim 1 wherein the heat conductive media comprises epoxy.

5. The method of claim 1 wherein the peripheral mold comprises epoxy.

6. The method of claim 1 wherein the electrical connectors comprise solder balls.

7. A method of assembling a flip chip in a package comprising:

coating a heat conductive substrate with a heat conductive material, attaching the heat conductive adhesive material to the back of the flip chip, mounting the flip chip to a package substrate using solder bumps attached between the front of the flip chip and the package substrate, there being a space left between the flip chip and the package substrate, under filling the space between the flip chip and the package substrate with a heat conductive media, encapsulating the flip chip against the package substrate with a peripheral mold such that at least a portion of the conductive substrate remains exposed, and attaching electrical connectors to the package substrate, to form the package.

8. The method of claim 7 wherein the heat conductive material comprises epoxy.

9. The method of claim 7 wherein the heat conductive substrate comprises a material selected from the group consisting of copper, copper/tungsten, aluminum, and ceramic.

10. The method of claim 7 wherein the heat conductive media comprises epoxy.

11. The method of claim 7 wherein the peripheral mold comprises epoxy.

12. The method of claim 7 wherein the electrical connectors comprise solder balls.

* * * * *